(12) United States Patent
Kim et al.

(10) Patent No.: US 7,453,712 B2
(45) Date of Patent: Nov. 18, 2008

(54) HYBRID FLASH MEMORY DEVICE AND METHOD FOR ASSIGNING RESERVED BLOCKS THEREOF

(75) Inventors: Seon-Taek Kim, Suwon-si (KR); Byoung-Kook Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 42 days.

(21) Appl. No.: 11/613,366

(22) Filed: Dec. 20, 2006

(65) Prior Publication Data
US 2008/0112238 A1    May 15, 2008

(30) Foreign Application Priority Data
Oct. 25, 2006    (KR) .................... 10-2006-0104151

(51) Int. Cl.
*G11C 5/06* (2006.01)
(52) U.S. Cl. .................... 365/63; 365/200; 365/230.03
(58) Field of Classification Search ............ 365/63, 365/200, 230.03, 185.33
See application file for complete search history.

(56) References Cited

U.S. PATENT DOCUMENTS

| 6,418,052 | B1 | 7/2002 | Shibata et al. | |
|---|---|---|---|---|
| 6,947,322 | B2 | 9/2005 | Anzai et al. | |
| 2006/0155917 | A1* | 7/2006 | Di Sena et al. | 711/103 |
| 2007/0233752 | A1* | 10/2007 | Bangalore et al. | 707/202 |

FOREIGN PATENT DOCUMENTS

| JP | 11-345491 | 12/1999 |
|---|---|---|
| JP | 2001-006374 | 12/2001 |
| JP | 2002-208287 | 7/2002 |
| JP | 2004-127481 | 4/2004 |
| KR | 1020040011387 | 2/2004 |
| KR | 1020050007653 | 1/2005 |
| KR | 1020060012696 | 2/2006 |
| KR | 1020060021548 | 3/2006 |
| KR | 1020070048384 | 5/2007 |

OTHER PUBLICATIONS

English Abstract for Publication No.: 2002-208287.
English Abstract for Publication No.: 1020050007653.
English Abstract for Publication No.: 1020060012696.
English Abstract for Publication No.: 1020060021548.
English Abstract for Publication No.: 1020070048384.

* cited by examiner

*Primary Examiner*—Thong Q Le
(74) *Attorney, Agent, or Firm*—F. Chau & Associates

(57) ABSTRACT

A hybrid flash memory device includes an array including a first area and a second area having a larger number of stored bits per cell than the first area. The device includes a hidden area including a first reserved block area and a second reserved block area, wherein the first reserved block area includes a plurality of first memory blocks having the same number of stored bits per cell as the first area, the second reserved block area includes a plurality of second memory blocks having the same number of stored bits per cell as the second area, and a flash translation layer configured to replace a bad block generated in the first main area with the first memory block and replace a bad block generated in the second main area with the second memory block, wherein the flash translation layer flexibly assigns functions of the first memory blocks or the second memory blocks depending on whether the first and second memory blocks are all used.

20 Claims, 7 Drawing Sheets

HYBRID FLASH MEMORY DEVICE AND METHOD FOR ASSIGNING RESERVED BLOCKS THEREOF

CROSS-REFERENCE TO RELATED APPLICATIONS

This U.S. non-provisional patent application claims priority under 35 U.S.C §119 of Korean Patent Application 2006-104151 filed on Oct. 25, 2006, the entirety of which is hereby incorporated by reference.

BACKGROUND

1. Technical Field

The present invention relates to semiconductor memory devices and, more specifically, to a method for assigning reserved blocks of a hybrid flash memory device in which single-bit cells and multi-bit cells are arranged in the same array.

2. Description of Related Art

Semiconductor memory devices may be categorized as volatile memory devices or non-volatile memory devices. The volatile memory devices can be classified into dynamic random access memories (DRAMs) and static random access memories (SRAMs). Data stored on a volatile semiconductor device is lost if a power supply is interrupted, while a non-volatile memory device retains stored data even when the power supply is interrupted. Thus, the non-volatile memories are widely used to store retention-required data. The non-volatile memories may be categorized as mask read-only memories (MROMs), programmable read-only memories (PROMs), erasable programmable read-only memories (EPROMs), and electrically erasable programmable read-only memories (EEPROMs).

The MROMs, PROMs, and EPROMs have difficulty in rewriting stored data because read and write operations cannot be freely conducted by users, unlike EEPROMs. EEPROMs are increasingly used in system programming needing continuous update or auxiliary memory devices. Typically, flash EEPROMs are used as mass storage devices because their integration density is higher than other types of EEPROM. Among the flash EEPROMs, a NAND-type flash EEPROM has a higher integration density than a NOR-type or AND-type flash EEPROM.

Single-bit data or multi-bit data (e.g., 2-bit data, 4-bit data, etc.) may be stored in each flash memory cell. With the ever-increasing demand for higher integration density of flash memories, studies have been conducted for multi-bit, multi-level or multi-state flash memory devices where data of multiple bits are stored in one memory cell.

The stage-to-state window of a multi-bit flash memory device is narrower than the window of a single-bit flash memory device. In the multi-bit flash memory device, a margin between a voltage applied to a wordline selected during a read operation and the edge of a threshold voltage distribution becomes narrower with the decrease in window width. Therefore, a multi-bit array has a higher possibility of invalid sensing caused by process variation or changes in voltage level of a selected wordline, an operation voltage, or temperature than a single-bit flash memory device. For this reason, single-bit flash memory devices are typically used as storage devices of information, such as BIOS information or font information, needing a superior storage characteristic. Multi-bit flash memory devices are typically as storage devices of information, such as voice information, which may remain viable despite occurrence of storage failure of one or more bits among mass consecutive information. Likewise characteristics of a multi-bit flash memory device and a single-bit flash memory device are closely associated with frequency of bad blocks (hereinafter, a block in which an error occurs is referred to as "bad block").

Reserved blocks are disposed inside a single-bit flash memory device and a multi-bit flash memory device to replace bad blocks, respectively. However, since the possibility of generating bad blocks in a multi-bit flash memory device is higher than that of bad blocks in a single-bit flash memory device, sizes of assigned reserved blocks should vary with data storage characteristics of flash memory devices. For example, for a hybrid flash memory device in which a single-bit flash memory and a multi-bit flash memory are mixed, reserved blocks should be assigned in consideration of all characteristics between the mixed flash memories. This is because usable reserved blocks are limited in number. When either reserved blocks for a single-bit flash memory or reserved blocks for a multi-bit flash memory are all used, a chip may no longer be used.

SUMMARY OF THE INVENTION

Exemplary embodiments of the present invention are directed to a hybrid flash memory device. In an exemplary embodiment, the hybrid flash memory device may include an array including a first area and a second area having a larger number of stored bits per cell than the first area; a hidden area including a first reserved block area and a second reserved block area, wherein the first reserved block area includes a plurality of first memory blocks having the same number of stored bits per cell as the first area, the second reserved block area includes a plurality of second memory blocks having the same number of stored bits per cell as the second area; and a flash translation layer configured to replace a bad block generated in the first main area with the first memory block and replace a bad block generated in the second main area with the second memory block, wherein the flash translation layer flexibly assigns functions of the first and second memory blocks depending on whether the first memory blocks or the second memory blocks are all used.

Exemplary embodiments of the present invention are directed to a computer-readable media embodying instructions executable by a processor to perform a method for assigning reserved blocks of a hybrid flash memory device. In an exemplary embodiment, the method may include setting a boundary of a first reserved block area for replacing bad blocks generated in a first block and a boundary of a second reserved block area for replacing bad blocks generated in a second area having a larger number of stored bits per cell than the first area, and flexibly assigning functions of memory blocks of the first and second reserved block areas when memory blocks of the first reserved block or the second reserved block area are all used.

DETAILED DESCRIPTION OF PREFERRED EMBODIMENTS

The present invention will now be described more fully hereinafter with reference to the accompanying drawings, in which exemplary preferred embodiments of the invention are shown. This invention, however, may be embodied in many different forms and should not be construed as limited to embodiments set forth herein. Rather, embodiments are provided so that this disclosure will be thorough and complete, and will fully convey the scope of the invention to those skilled in the art. Like numbers refer to like elements throughout.

Figure 1:
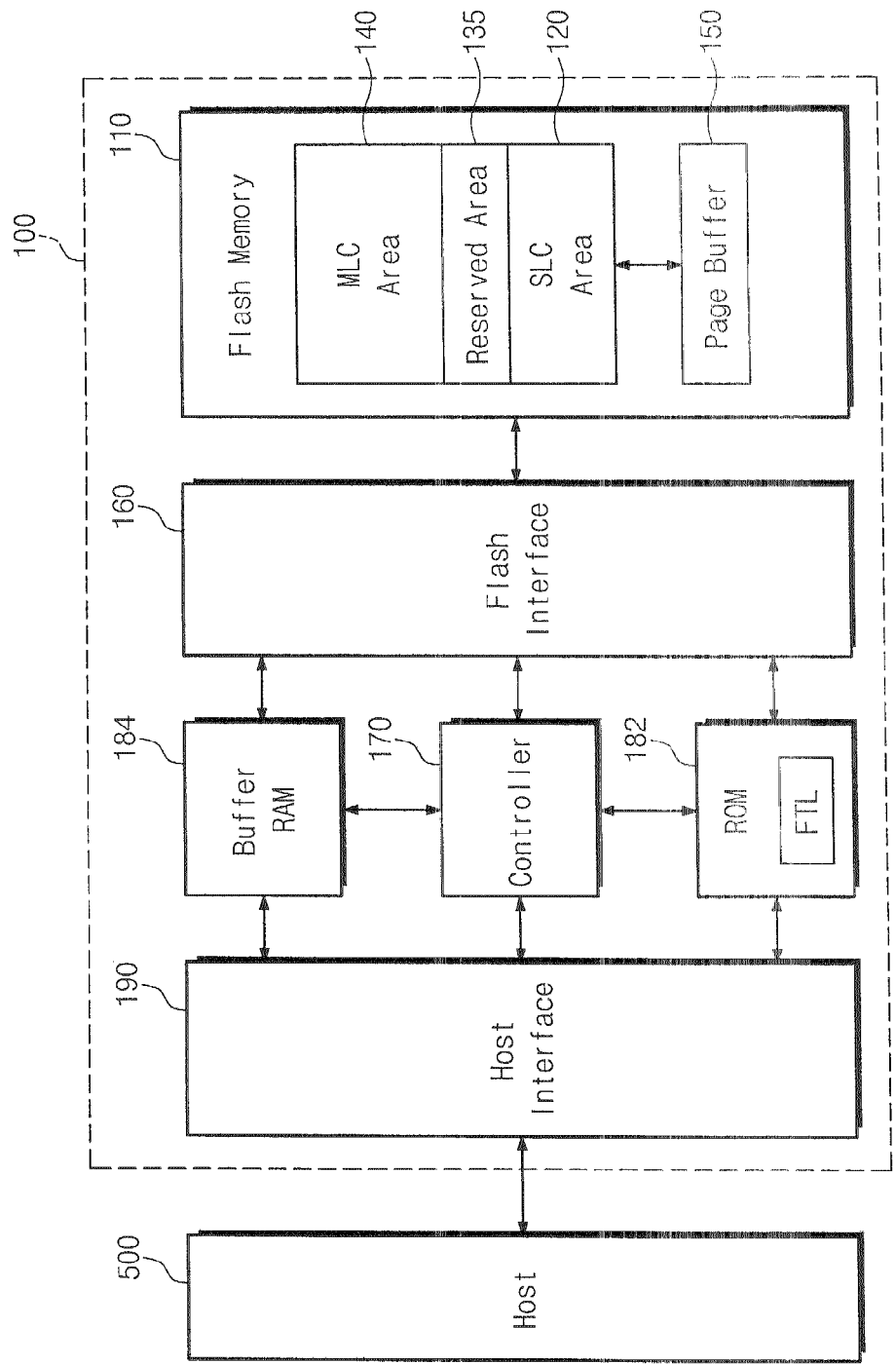
FIG. 1 is a block diagram of a hybrid flash memory device according to an embodiment of the present invention.

FIG. 1 illustrates a configuration of a hybrid flash memory device 100 according to an embodiment of the present invention. Specifically, the hybrid flash memory device 100 is a hybrid OneNAND flash memory device in which at least two memory cells differing in the number of stored bits per cell are formed on the same chip.

Referring to FIG. 1, the hybrid flash memory device 100 interfaces with a host 500 through a host interface 190. The host interface 190 between the hybrid flash memory device 100 and the host 500 implements a NOR interface method that is well known in the art. Nonetheless, it will be understood by those skilled in the art that the above-mentioned interface method is merely exemplary and may be another interface method such as, for example, a NAND interface method. While the hybrid flash memory device 100 may be an OneNAND flash memory device, it will be understood by those skilled in the art that the construction of the hybrid flash memory device 100 is not limited to the description herein.

The hybrid flash memory device 100 includes a flash memory unit 110, a flash interface 160, a controller 170, a ROM 182, a buffer RAM 184, and the host interface 190.

The flash memory unit 110 includes a memory cell array having a single-bit area 120 (hereinafter referred to as "SLC area"), a hidden area (see 130 of FIG. 2), a multi-bit area 140 (hereinafter referred to as "MLC area") and a page buffer circuit 150. The memory cell array is divided into a main array including the SLC area 120 and the MLC area 140 and the hidden area 130 including a reserved block area 135.

The SLC area 120 includes a plurality of SLC memory blocks. Although not illustrated in figures, memory cells of respective memory blocks included in the SLC area 120 are SLC memory cells and configured to have a string structure. Memory cells of respective memory blocks included in the MLC area 140 are MLC memory cells and configured to have a string structure. In the hidden area 130, user-invisible information is stored, including e.g., meta data of a flash translation layer (hereinafter referred to as "FTL") such as address mapping information. The reserved block area 135 of the hidden area 130 is used to replace bad blocks. Similar to the SLC area 120 and the MLC area 140, the reserved block area 135 includes a plurality of memory blocks. Memory cells of respective memory blocks included in the reserved block area 135 are configured to have a string structure. Rows of the SLC area 120, the reserved block area 135, and the MLC area 140 are driven by means of a row decoder circuit (not shown), and columns thereof are driven by means of a page buffer circuit 150.

The page buffer circuit 150 is controlled by the controller 170 and functions as a write driver or a sense amplifier according to operation mode. For example, the page buffer circuit 150 functions as a sense amplifier during a read operation mode and as a write drive during a program operation mode. The page buffer circuit 150 includes a plurality of page buffers PB corresponding to respective bitlines or bitline pairs.

The ROM 182 is controlled by the controller 170. The FTL is stored in the ROM 182, mapping logic addresses generated by a file system in a program operation of a flash memory to physical addresses of a flash memory device where an erase operation is conducted. The FTL may be software or firmware-type hardware. Examples of address mapping conducted at the FTL are disclosed in U.S. Pat. No. 5,404,485 entitled "FLASH FILE SYSTEM", U.S. Pat. No. 5,937,425 entitled "FLASH FILE SYSTEM OPTIMIZED FOR PAGE-MODE FLASH TECHNOLOGIES", and U.S. Pat. No. 6,318,176 entitled "METHOD OF DRIVING REMAPPING IN FLASH MEMORY AND FLASH MEMORY ARCHITECTURE SUITABLE THEREFOR".

The buffer RAM 184 is controlled by the controller 170 and configured to temporarily store data supplied from the host 500 or the page buffer 150. Also the buffer RAM 184 plays a role in loading and executing the FTL stored in the ROM 182 under the control of the controller 170, while the buffer RAM 184 may be a static random access memory (SRAM), the buffer RAM 184 may be implemented using other memory types. It will be understood by those skilled in the art that the buffer RAM 184 may be, for example, a dynamic random access memory (DRAM).

The controller 170 controls general operations of the flash memory device 100. For example, when program erase or read operations are requested from the host 500, the controller 170 controls the flash interface 160 and the buffer RAM 184 to conduct these requested operations. The flash interface 160 is an interface between the buffer RAM 184 and the page buffer circuit 150 under the control of the controller 170.

Although described in detail below, the flash memory device 100 replaces a bad block with a memory block of the reserved block area 135 when an error occurs at the SLC area 120 or the MLC area 140. Data stored in the bad block migrates to the replacement memory block. The data migration may be done through a data read operation or a copyback operation. Replacing the bad block with the memory block of the reserved block area 135 is done by means of the FTL. The reserved block area 135 is divided into an SLC reserved block area for replacing bad blocks of the SLC area 120 and an MLC reserved block area for replacing bad blocks of the MLC area 140. A boundary between the SLC reserved block area and the MLC reserved block area is flexibly variable. Alternatively, SLC memory blocks of the SLC reserved block area and MLC memory blocks of the MLC reserved block area are variable while a boundary between the SLC reserved block area and the MLC reserved block area is fixed. As a result, bad blocks of the SLC area 120 may be replaced with memory blocks of the MLC reserved block area, and bad blocks of the MLC area 140 may be replaced with memory blocks of the SLC reserved block area. According to the flexible operation for replacing bad blocks with memory blocks of a reserved block area, bad blocks generated in single-bit cells and multi-bit cells are efficiently replaced even with a limited reserved block area 135 to extend the lifespan of a chip.

Figure 2:
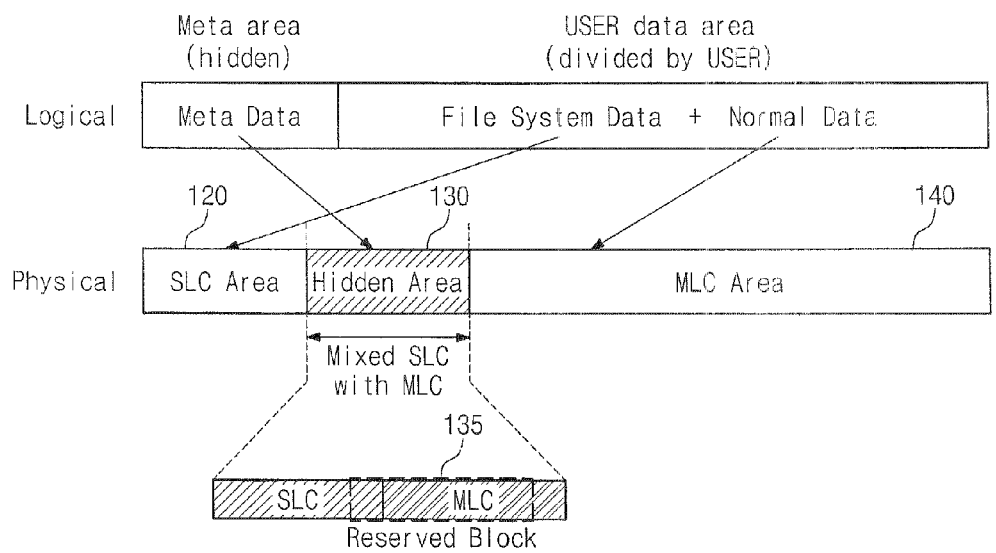
FIG. 2 shows an example of data storage for an SLC area, a reserved block area, and an MLC area illustrated in FIG. 1.
Figure 3:
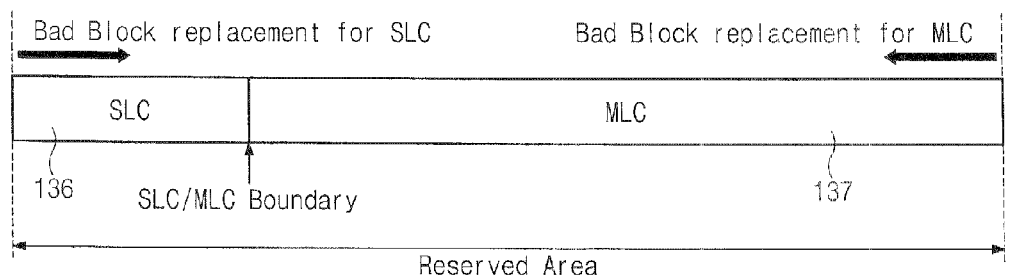
FIG. 3 shows an example of configuration and data storage for the reserved block area illustrated in FIG. 2.

FIG. 2 shows an example of data storage for the SLC area 120, the reserved block area 135, and the MLC area 140 illustrated in FIG. 1, and FIG. 3 shows an example of a configuration and data storage for the reserved block area 135 illustrated in FIG. 2. FIG. 2 exemplarily illustrates a logical data structure used in a file system of a flash memory and physical data structure of a flash memory in which logic data is stored.

Referring to FIG. 2 frequent-update-required data, such as file system data, is stored in the SLC area 120. Massive normal data input/output by the user is stored in the MLC area 140. The SLC area 120 and the MLC area 140 constitute a main array. As illustrated in FIG. 1 and FIG. 2, a flash memory in which an SLC area 120 and an MLC area 140 are mixed to constitute a main array is called a hybrid flash memory Meta data is stored in the hidden area 130 as data that cannot be randomly written/read by user, i.e., user-invisible added data. The meta data stored in the hidden area 130 includes address mapping table of the FTL. Similar to the main array, the hidden area 130 includes an MLC area and an SLC area. Meta data is stored in the SLC area of the hidden area 130 to ensure an accuracy of data. As described above, if data are segmentally stored in the SLC area 120, MLC area 140, and the hidden area 130 according to the characteristics of the data respectively, accuracy of the data as well as input/output speed of the data may be managed efficiently, SLC area and MLC area included in a hidden area 130 are partly assigned to a reserved block area 135. As illustrated in FIG. 3, a reserved block area 135 is divided into an SLC reserved block area 136 for replacing bad blocks of an SLC area 120 and an MLC reserved block area 137 for replacing bad blocks of an MLC area 140. Bad block replacement for the SLC area 120 and the MLC area 140 is done by the FTL. A result of the bad block replacement done by the FTL is stored in the foregoing hidden area 130 (e.g., SLC area of the hidden area 130) as meta data. Apart from the reserved block area 135, a hidden area in which meta data is stored may be set as a data storage area. The result of the bad block replacement may be stored and managed with the shape of table. An initial value of a boundary between the SLC reserved block area 136 and the MLC reserved block area 137 (SLC/MLC boundary. hereinafter referred to as "reserved area boundary") is set by the FTL. Due to cell characteristics, a possibility of generating a bad block in the MLC area 140 is higher than that of generating a bad block in the SLC area 120. Accordingly, a reserved area boundary may be defined such that category (i.e., size) of the MLC reserved block area 137 corresponding to the MLC area 140 is larger than that of the SLC block area 136, as illustrated in FIG. 3.

Referring to FIG. 3, the SLC reserved block area 136 and the MLC reserved block area 137 replace bad blocks in an arrow direction, i.e., from the outermost block of the SLC reserved block area 136 and the outermost block of the MLC reserved block area 136 to a block disposed at the reserved area boundary. The reserved area boundary defined by the FTL may have a fixed value or may vary with whether the SLC reserved block area 136 and the MLC reserved block area 137 are reserved.

Figure 4:
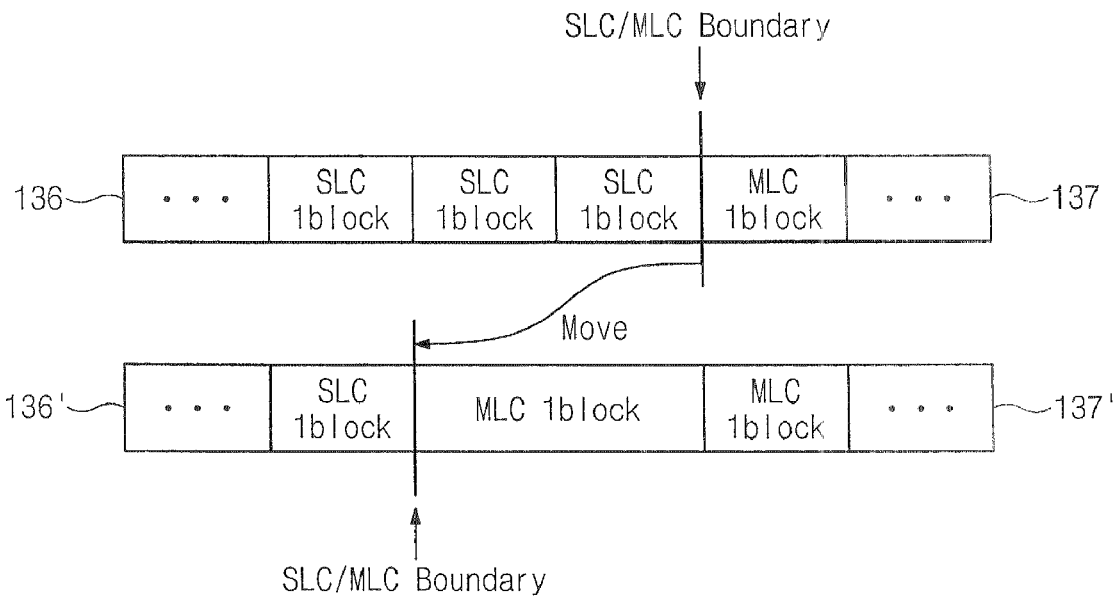
FIG. 4 and FIG. 5 show a method for assigning an SLC reserved block area and an MLC reserved block area according to an embodiment of the present invention.
Figure 5:
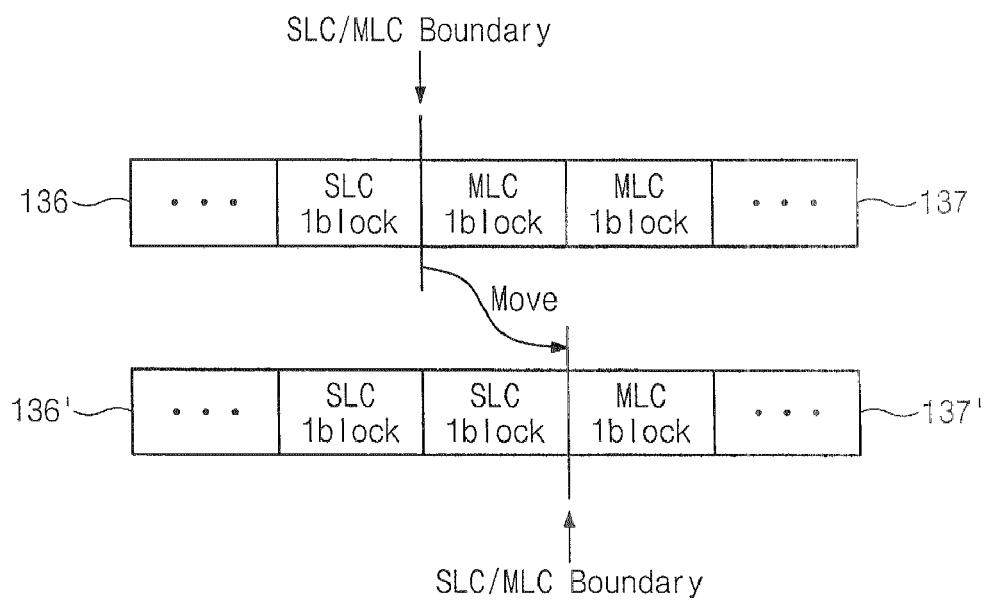

FIG. 4 and FIG. 5 exemplarily illustrate a method for assigning an SLC reserved block area 136 and an MLC reserved block area 137 in the case where the reserved area boundary is variable.

Referring to FIG. 4, after memory blocks of the MLC reserved block area 137 corresponding to an MLC area 140 are all used, the reserved area boundary may migrate (or vary) in a direction of the SLC reserved block area 136. The migration of the reserved area boundary is done by means of the FTL. With the migration of the reserved area boundary, a size of the SLC reserved block area 136' decreases while a size of the MLC reserved block area 137' increases. Moreover, new memory blocks are assigned to the MLC reserved block area 137'. The new assigned memory blocks are memory blocks included in the SLC reserved block area 136 before the migration of the reserved area boundary. Information on the reserved area boundary is updated and stored in the hidden area 130 (e.g., a hidden information storage area including an SLC area of the hidden area 130) as meta data. In the case where the reserved area boundary migrates, two adjacent SLC blocks included in the SLC reserved block area 136 are assigned to a new MLC reserved block area 137' as one MLC block. The number of SLC blocks and the number of MLC blocks corresponding to the SLC blocks are variable with the number of bits stored in a memory cell. For example, four SLC blocks may correspond to one MLC block with the increase in the number of bits stored in each memory cell.

Referring to FIG. 5, after memory blocks of the SLC reserved block area 136 corresponding to an SLC area 120 are all used, the reserved area boundary may migrate in direction of the MLC reserved block area 137. The migration of the reserved area boundary is done by means of the FTL. With the migration of the reserved area boundary, the size of the MLC reserved block area 137' decreases while the size of the SLC reserved block 136' increases. Information on the reserved area boundary is updated and stored in a hidden area 130 (e.g., a hidden information storage area including the SLC area of the hidden area 130) as mete data. In the case where the reserved area boundary migrates, one MLC block included in the MLC reserved block area 137 is assigned in a new SLC reserved block area 136' as one SLC block. However, the above configuration is merely exemplary, and the number of SLC blocks and the number of MLC blocks corresponding to the SLC blocks are variable with the number of bits stored in a memory cell. For example, one MLC block may be divided into two sub-MLC blocks and each of the sub-MLC blocks may be used as one SLC block.

Figure 6:
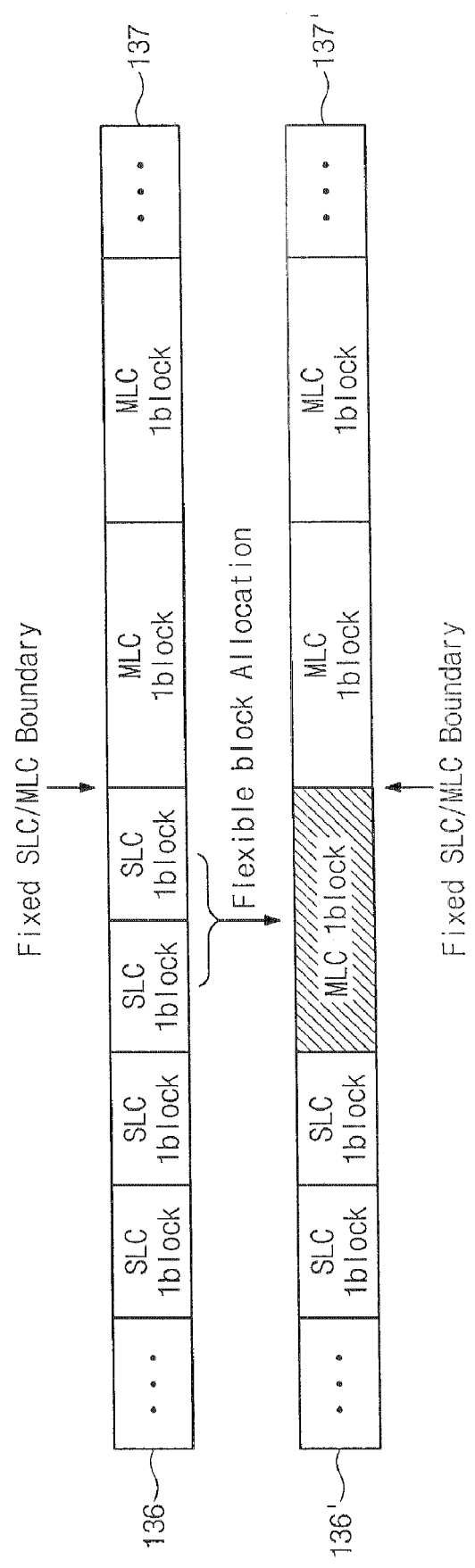
FIG. 6 and FIG. 7 show a method for assigning an SLC reserved block area and an MLC reserved block area according to another embodiment of the present invention.
Figure 7:
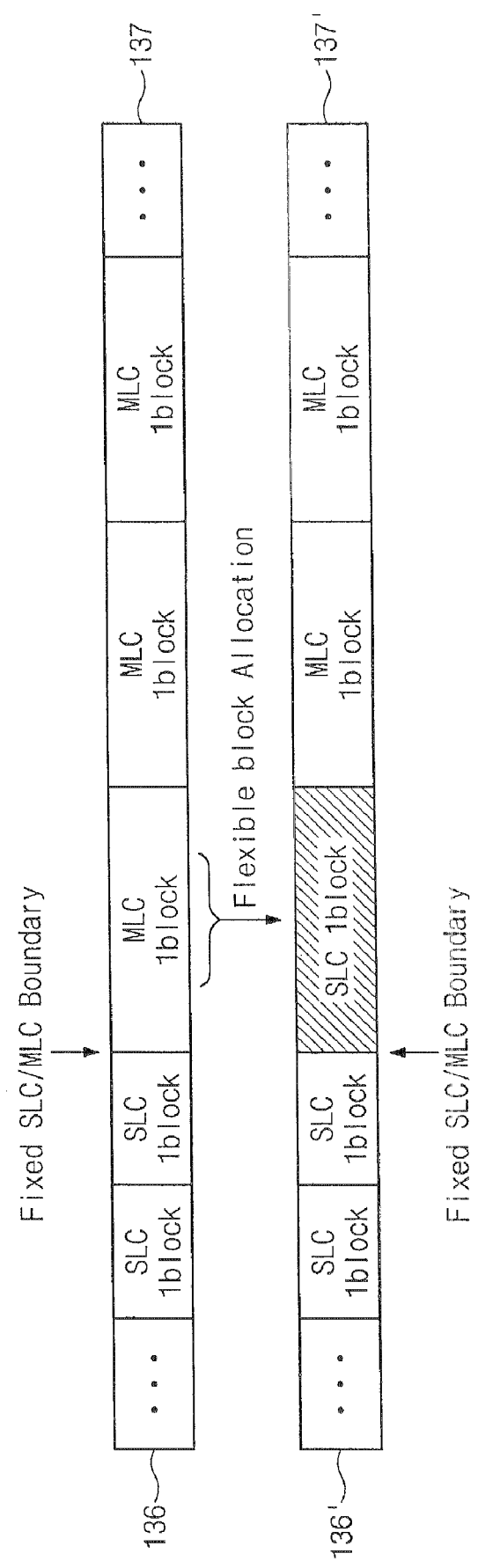

FIG. 6 and FIG. 7 are exemplary illustrations of a method for assigning memory blocks in the SLC reserved block area 136 and the MLC reserved block area 137 in the case where a reserved area boundary is fixed.

Referring to FIG. 6, after memory blocks of the MLC reserved block area 137 corresponding to the MLC area 140 are all used, an area including non-replaced SLC blocks among the SLC reserved block area 136 may be used as the MLC reserved block area (see a deviant crease part). In this case, two adjacent SLC blocks are diverted to one MLC block. The diverted memory block is replaced with a bad block generated in an MLC area 140. An operation of diverting SLC blocks to an MLC block and an operation of replacing a diverted memory block with a bad block are conducted by means of the FTL. Information on the function of a diverted block is stored in the hidden region 130 (e.g., a hidden information storage area including an SLC area of the hidden area 130) as meta data. The number of SLC blocks and the number of MLC blocks corresponding to the SLC blocks are variable with the number of bits stored in a memory cell, respectively. For example, four SLC blocks may be diverted to one MLC block with the increase in number of bits stored in each memory cell. The SLC blocks diverted to the MLC reserved block area are not limited to SLC blocks disposed at a specific position.

Referring to FIG. 7, after memory blocks of the SLC reserved block area 137 corresponding to the SLC area 120 are all used, an area including non-replaced MLC blocks among the MLC reserved block area 137 may be used as the SLC reserved block area (see a deviant crease part). In this case, one MLC block is diverted to one SLC block. The diverted memory block is replaced with a bad block generated in the SLC area 120. An operation of diverting MLC blocks to the SLC block and an operation of replacing a diverted memory block with a bad block are conducted by means of the FTL. Information on the function of a diverted block is stored in a hidden region 130 (e.g., a hidden information storage area including an SLC area of the hidden area 130) as meta data. The number of SLC blocks and the number of MLC blocks corresponding to the SLC blocks are variable with the number of bits stored in a memory cell, respectively. For example, one MLC block may be divided into two sub-MLC blocks and each of the sub-MLC blocks may be used as one SLC block. The MLC blocks diverted to an SLC reserved block area are not limited to MLC blocks disposed at a specific position.

Figure 8:
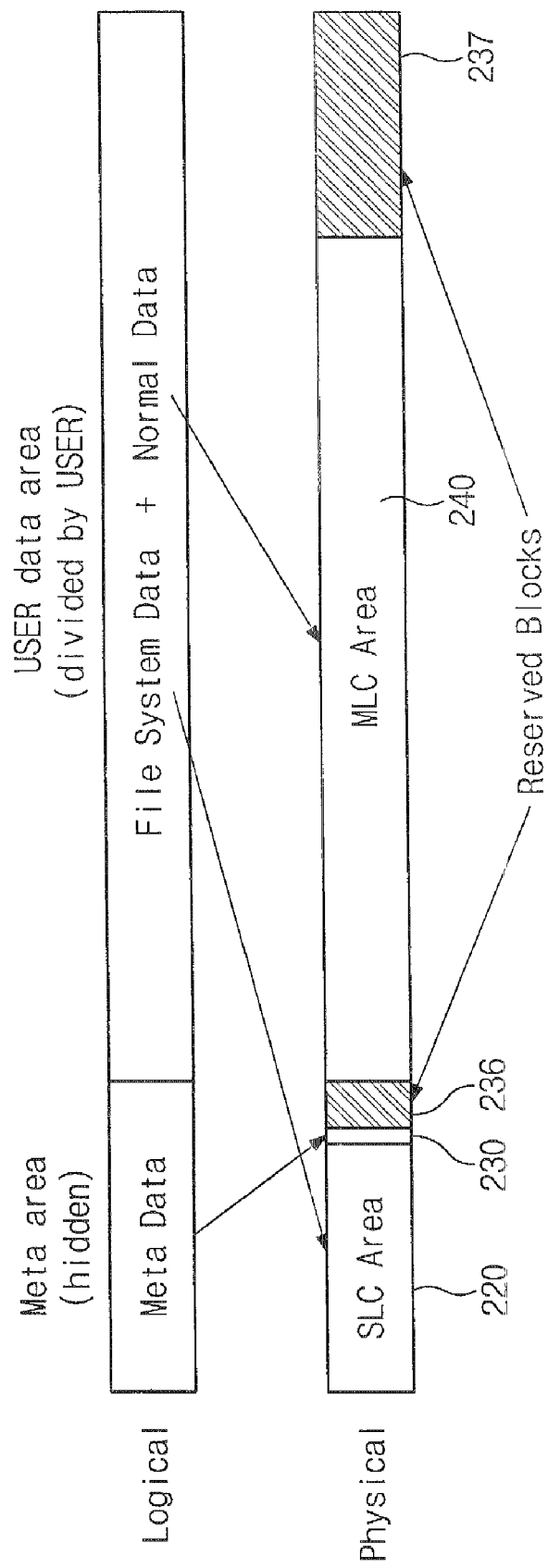
FIG. 8 shows an example of data storage for an SLC area, SLC and MLC reserved block areas, and an MLC area according to another embodiment of the present invention.

FIG. 8 shows an example of data storage for an SLC area 220, SLC and MLC reserved block areas 236 and 237, and an MLC area 240 according to another embodiment of the present invention. The SLC area 220 and the MLC area 240 constitute a main area, storing user data. A hidden information storage area 230 and the SLC reserved block area 236 are disposed between the SLC area 220 and the MLC area 240. The MLC reserved block area 237 is disposed adjacent to the MLC area 240. The hidden information storage area 230, the SLC reserved block area 236, and the MLC reserved block area 237 constitute a hidden area in which user-invisible data is stored. In a hybrid flash memory device, a main array and a hidden area are formed on the same memory cell array. As illustrated in FIG. 8, the SLC reserved block area 236 and the MLC reserved block area 237 may be disposed on the same memory cell array to be physically spaced apart from each other.

In the SLC area 220, the hidden information storage area 230, and the MLC area 240 of FIG. 8 and those of FIG. 2, their data storage methods are identical to each other while their dispositions are different from each other. Thus, the data storage methods based on respective data characteristics will not be described in further detail.

Figure 9:
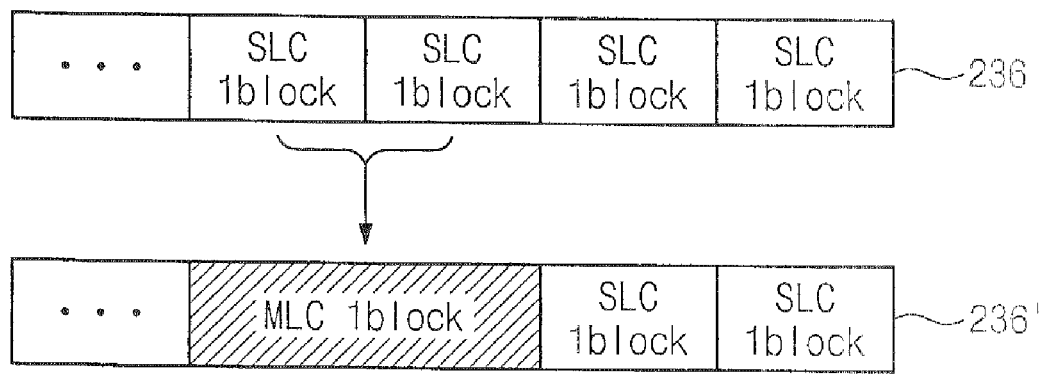
FIG. 9 and FIG. 10 show a method for assigning the SLC reserved block area and the MLC reserved block area illustrated in FIG. 8.
Figure 10:
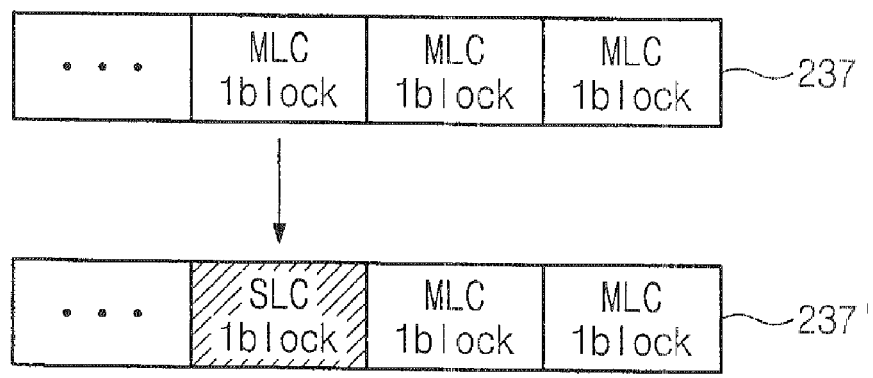

FIG. 9 and FIG. 10 are exemplary illustrations of a method for assigning the SLC reserved block area 236 and the MLC reserved block area 237 of FIG. 8 in the case where a reserved area boundary is fixed.

Referring to FIG. 9, after memory blocks of the MLC reserved block area 237 corresponding to the MLC area 240 are all used, an area including non-replaced SLC blocks among the SLC reserved block area 236 may be used as the MLC reserved block area (see a deviant crease part). In this case, two adjacent SLC blocks are diverted to one MLC block. A method of diverting memory blocks illustrated in FIG. 9 is substantially identical to that illustrated in FIG. 6. The number of SLC blocks and the number of MLC blocks corresponding to the SLC blocks are variable with the number of bits stored in a memory cell. For example, at least four SLC blocks may be diverted to one MLC block with the increase in number of bits stored in each memory cell. The SLC blocks diverted to the MLC reserved block area are not limited to SLC blocks disposed at specific positions.

Referring to FIG. 10, after memory blocks of the SLC reserved block area corresponding to the SLC area 220 are all used, an area including non-replaced MLC blocks among the MLC reserved block area 237 may be used as the SLC reserved block area (see a deviant crease part). In this case, one MLC block is diverted to one SLC block. A method of diverting memory blocks illustrated in FIG. 10 is substantially identical to that illustrated in FIG. 7. The number of SLC blocks and the number of MLC blocks corresponding to the SLC blocks are variable with the number of bits stored in a memory cell, respectively. For example, one MLC block may be divided into two sub-MLC blocks and each of the sub-MLC blocks may be used as one SLC block. The MLC blocks diverted to an SLC reserved block area are not limited to MLC blocks disposed at specific positions.

In a flash memory device according to embodiments of the present invention, when error occurs in an SLC area or an MLC area, a bad block in which the error exist is replaced with a memory block of a reserved block area. The reserved block area is divided into an SLC reserved block area for replacing a bad block of an SLC area and an MLC reserved block area for replacing a bad block of an MLC area. After a preset SLC or MLC reserved block area is completely used, a boundary between an SLC reserved block area and an MLC reserved block area is flexibly changed to assign a new reserved memory block to the completely used SLC or MLC reserved block area. Alternatively, an SLC memory block included in the SLC reserved block area and an MLC memory block included in the MLC reserved block area are selectively variable in function while keeping the boundary between the SLC reserved block area and the MLC reserved block area fixed. Accordingly, in a memory device where a single-bit flash memory device and a multi-bit flash memory device are mixed, reserved blocks are flexibly assigned considering all characteristics of the mixed memory devices. As a result, a bad block is replaced without increasing a size of a reserved block to extend the lifespan of a chip.

Although the present invention has been described in connection with embodiments of the present invention illustrated in the accompanying drawings it is not limited thereto. It will be apparent to those skilled in the art that various substitutions, modifications and changes may be made without departing from the scope and spirit of the disclosure.

What is claimed is:

1. A hybrid flash memory device comprising:
an array including a first area and a second area having a larger number of stored bits per cell than the first area;
a hidden area including a first reserved block area and a second reserved block area, wherein the first reserved block area includes a plurality of first memory blocks having the same number of stored bits per cell as the first area, the second reserved block area includes a plurality of second memory blocks having the same number of stored bits per cell as the second area; and
a flash translation layer configured to replace a bad block generated in the first area with the first memory blocks and replace a bad block generated in the second area with the second memory blocks, wherein the flash translation layer flexibly assigns functions of the first and second memory blocks depending on whether the first memory blocks or the second memory blocks are all used.

2. The hybrid flash memory device as set forth in claim 1, wherein the flash translation layer is configured to replace the bad block generated in the first area using the one or more second memory blocks when the first memory blocks are all used.

3. The hybrid flash memory device as set forth in claim 1, wherein the flash translation layer is configured to replace the bad block generated in the second area using the two or more first memory blocks when the second memory blocks are all used.

4. The hybrid flash memory device as set forth in claim 1, wherein the boundary between the first and second reserved block areas is fixed.

5. The hybrid flash memory device as set forth in claim 1, wherein the boundary between the first and second reserved block areas is flexibly variable according to whether the first memory blocks or the second memory blocks are all used.

6. The hybrid flash memory device as set forth in claim 1, wherein the flash translation layer is configured to vary the boundary between the first and second reserved block areas to extend the first reserved block area when the first memory blocks are all used.

7. The hybrid flash memory device as set forth in claim 1, wherein the flash translation layer is configured to vary the boundary between the first and second reserved block areas to extend the second reserved block area when the second memory blocks are all used.

8. The hybrid flash memory device as set forth in claim 1, wherein the hidden area further includes a hidden information storage area in which memory block assignment information of the first and second reserved block areas is stored.

9. The hybrid flash memory device as set forth in claim 8, wherein a result of replacement for the bad block generated in the first or second area is stored in the hidden information storage area.

10. The hybrid flash memory device as set forth in claim 1, being a one-NAND flash memory device.

11. A computer readable media embodying instructions executable by a processor to perform a method for assigning reserved blocks of a flash memory device, the method comprising:

setting a boundary of a first reserved block area for replacing bad blocks generated in a first block and a boundary of a second reserved block area for replacing bad blocks generated in a second area having a larger number of stored bits per cell than the first area; and flexibly assigning functions of memory blocks of the first and second reserved block areas when memory blocks of the first reserved block or the second reserved block area are all used.

12. The method as recited in claim 11, wherein the boundary of the second reserved block area is set larger than that of the first reserved block area.

13. The method as recited in claim 11, further comprising replacing the bad block generated in the first area with at least one memory block included in the second reserved block area when memory blocks included in the first reserved block area are all used.

14. The method as recited in claim 11, further comprising replacing the bad block generated in the second area with at least two memory blocks included in the first reserved block area when memory blocks included in the second reserved block area are all used.

15. The method as recited in claim 11, wherein the boundary between the first and second reserved block areas is fixed.

16. The method as set forth in claim 11, wherein the boundary between the first and second reserved block areas is flexibly variable with whether the first memory blocks or the second memory blocks are all used.

17. The method as recited in claim 11, further comprising changing the boundary between the first and second reserved block areas to extend the first reserved block area when memory blocks of the first reserved block area are all used.

18. The method as recited in claim 11, further comprising changing the boundary between the first and second reserved block areas to extend the second reserved block area when memory blocks of the second reserved block area are all used.

19. The method as recited in claim 11, flexibly assigning functions of memory blocks further comprises:

storing area assignment information of the first and second reserved block areas in a hidden information storage area of a flash memory device.

20. The method as recited in claim 11, flexibly assigning functions of memory blocks further comprises:

storing a result of replacement for the bad block generated in the first or second area in a hidden information storage area of a flash memory device.

* * * * *